(12) United States Patent
Verma et al.

(10) Patent No.: US 7,198,963 B2
(45) Date of Patent: Apr. 3, 2007

(54) METHODOLOGIES FOR EFFICIENT INSPECTION OF TEST STRUCTURES USING ELECTRON BEAM SCANNING AND STEP AND REPEAT SYSTEMS

(75) Inventors: Gaurav Verma, Atherton, CA (US); Kurt H. Weiner, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 59 days.

(21) Appl. No.: 10/638,027

(22) Filed: Aug. 8, 2003

(65) Prior Publication Data

US 2004/0207414 A1    Oct. 21, 2004

Related U.S. Application Data

(60) Provisional application No. 60/463,544, filed on Apr. 16, 2003.

(51) Int. Cl.
 *H01L 21/66* (2006.01)
(52) U.S. Cl. ............................. 438/14; 438/16; 438/17; 257/E21.525
(58) Field of Classification Search ................. 438/14, 438/16, 17, 10, 18; 324/751; 257/48
See application file for complete search history.

(56) References Cited

U.S. PATENT DOCUMENTS 5,059,031 A * 10/1991 Hamel et al. ............... 356/428
6,433,561 B1 * 8/2002 Satya et al. ................. 324/753
6,509,197 B1    1/2003 Satya et al. ................... 438/12
6,855,568 B2 * 2/2005 Weiner et al. ................ 438/17
6,921,672 B2 * 7/2005 Satya et al. ................... 438/18

OTHER PUBLICATIONS

KLA-Tencor, "Automated e-beam inspection", www.kla-tencor.com, printed Nov. 8, 2002. Copyright 2002.
KLA-Tencor, "E-beam defect review", www.kla-tencor.com, printed Nov. 8, 2002. Copyright 2002.
Weiner, et al., "Apparatus and Methods for Semiconductor IC Failure Detection", U.S. Appl. No. 10/264,625, filed Oct. 2, 2002.

* cited by examiner

*Primary Examiner*—Michael Trinh
(74) *Attorney, Agent, or Firm*—Beyer Weaver LLP

(57) ABSTRACT

Disclosed are techniques for efficiently inspecting defects on voltage contrast test. In one embodiment, methodologies and test structures allow inspection to occur entirely within a charged particle system. In a specific embodiment, a method of localizing and imaging defects in a semiconductor test structure suitable for voltage contrast inspection is disclosed. A charged particle beam based tool is used to determine whether there are any defects present within a voltage contrast test structure. The same charged particle beam based tool is then used to locate defects determined to be present within the voltage contrast test structure. Far each localized defect, the same charged particle beam based tool may then be used to generate a high resolution image of the localized defect whereby the high resolution image can later be used to classify the each defect. In one embodiment, the defect's presence and location are determined without rotating the test structure relative to the charged particle beam.

17 Claims, 11 Drawing Sheets

METHODOLOGIES FOR EFFICIENT INSPECTION OF TEST STRUCTURES USING ELECTRON BEAM SCANNING AND STEP AND REPEAT SYSTEMS

CROSS REFERENCE TO RELATED APPLICATIONS

This application claims priority of U.S. Provisional Patent Application No. 60/463,544 filed 16 Apr. 2003, which application is incorporated herein by reference in its entirety for all purposes.

BACKGROUND OF THE INVENTION

This invention relates to methods and apparatus for detecting electrical defects in a semiconductor device or test structure. Additionally, it relates to generating an image of each identified defect for use in various defects analysis procedures, such as automatic defect classification.

Several different types of systems and techniques exist for identifying electrical defects, such as shorts and opens, on a semiconductor device or test structure. Commonly, test structures include probe pads that can be electrically probed to detect the existence of opens or shorts within such test structure. Another type of test structure is referred to as a voltage contrast type test structure. Electrical defects can be detected in a voltage contrast type test structure using an electron beam (e-beam) based tool. The e-beam based tool scans an electron beam over the test structure which causes portions of the scanned test structure to retain charge. Secondary and/or backscattered electrons are emitted from portions of the scanned test structure in response to the incident e-beam. The voltage contrast test structure is typically designed to have a first set of structures coupled to the substrate and a second set of structures which are left floating.

Several voltage contrast type test structures and methodologies for rapidly inspecting these test structures are described in U.S. Pat. No. 6,509,197, issued 21 Jan. 2003, by Akella V. S. Satya et al., which patent is incorporated herein by reference in its entirety. FIG. 1 illustrates a typical voltage contrast test structure 1100. This test structure 1100 includes alternating floating conductive lines 1104 and grounded conductive lines 1102 coupled to the substrate (not shown). One end (1105) of the conductive lines 1102 is coupled with the substrate, while the other end of both conductive lines 1102 and 1104 project into an initial scan area 1101. As the e-beam scans over the conductive line ends, the grounded and floating structures will obtain different voltage potentials in response to the e-beam. The potential differences in the grounded and floating conductive structures result in different secondary/backscattered electron intensities during the e-beam inspection. The different intensities of secondary/backscattered electrons emitted from the conductive structure are typically converted into a voltage contrast image such that a low potential portion of, for example, a conductive structure might be displayed as bright (intensity of the secondary electron emission is high) and a high potential portion might be displayed as dark (lower intensity secondary electron emission). Alternatively, the system may be configured such that a low potential portion might be displayed as dark and a high potential portion might be displayed as bright.

The voltage contrast type test structure is typically designed to produce a particular "expected" pattern of voltage potentials and brightness levels in an image generated during a voltage contrast inspection. Hence, when the image differs significantly from the expected intensity pattern, the test structure is identified as having a defect. In the example of FIG. 1, the conductive line ends which extend into the initial scan area 1101 are expected to appear as alternating bright and dark line ends. Opens and shorts within the conductive lines 1102 may be detected by scanning across the conductive line ends within the initial scan area 1101 in direction 1103. As shown, a conductive line 1104c which is designed to remain floating is shorted to an adjacent grounded structure 1102 so that conductive line 1104c appears bright, instead of having its expected dark appearance. After a defect is found within a particular conductive line, the defect may then be located more precisely by rotating the test structure relative to the e-beam and scanning the defective conductive line 1104c along direction 1106. The time required to rotate and realign the test structure can be significant.

Typically, a rapid e-beam scanning system, such as an eS20XP inspection tool available from KLA-Tencor, Corp of San Jose, Calif., is used to localize defects within a voltage contrast structure. Because conventional e-beam scanning tools cannot typically generate high resolution images of the defect, the voltage contrast test structure is transferred to a high resolution e-beam step and repeat system after a defect is localized. The e-beam step and repeat system is designed to generate a high resolution image of the defect that was previously localized with the e-beam scanning system. The resulting high resolution image of the defect may then be analyzed, e.g., classified. In an alternative methodology, defective structures are identified by probing the test structure with an electrical probe. The defect location within the failing test structure is typically identified in this methodology by using a scanning e-beam system. Subsequently, a high resolution image of the defect can be obtained using a step and repeat e-beam system. The localization of the defect within the failing structure can also be accomplished using a step and repeat system, however, at a significant time and throughput penalty.

The above described defect inspection techniques require multiple tools to localize and image the defects for classification. These methodologies also typically require rotation of the test structures in a scanning e-beam system thereby increasing the complexity of operation and negatively impacting the throughput. This produces systems that are complex and expensive. These techniques require multiple tools to perform the task because e-beam step and repeat systems are inefficient at localizing defects on a wafer and e-beam scanning and probe type systems provide poor or no high resolution images of the defects.

Accordingly, there is a need for improved methods for localizing electrical defects and if required generating a relatively high resolution image of electrical defects in semiconductor devices, test structures, and the like. Additionally, there is a need for improved voltage contrast test structures for facilitating such improved methods.

SUMMARY OF THE INVENTION

Accordingly, improved techniques are provided for efficiently inspecting defects on voltage contrast test structures. Improved test structures for facilitating such techniques are also provided. In one embodiment, the methodologies and test structures allow inspection to occur entirely within a charged particle (e.g., e-beam) system, such as a step and repeat e-beam system. In a specific embodiment, a method of localizing and imaging defects in a semiconductor test structure suitable for voltage contrast inspection is disclosed. A charged particle beam based tool is used to determine whether there are any defects (e.g., open or short defects) present within a voltage contrast test structure. The same charged particle beam based tool is then used to locate defects determined to be present within the voltage contrast test structure. For each localized defect, the same charged particle beam based tool is then used to generate a high resolution image of the localized defect whereby the high resolution image can later be used to classify the each defect. The determination as to whether there are any defects present within the voltage contrast test structure is accomplished by inspecting a single area of the voltage contrast test structure that fits within the charged particle beam based tool's field of view.

In a preferred embodiment, the charged particle beam based tool is a charged particle beam step and repeat system, and locating defects is accomplished by stepping the same charged particle beam relative to a portion of the voltage contrast test structure. In a specific implementation, the high resolution image has a resolution that is at least about 0.04 μm. In a specific implementation, determining whether there is a defect present is accomplished by (a) directing a charged particle beam of the tool over a first area of the test structure, wherein the first area fits within a single field of view of the tool, (b) determining whether a voltage potential pattern of the first area corresponds to an expected potential pattern, wherein the voltage potential pattern of the first area is in response to the charged particle beam being directed at the first area, and (c) determining that the test structure has a defect when the voltage potential pattern of the first area does not correspond to the expected potential pattern. In a specific implementation, the expected potential pattern corresponds to one or more conductive portions having about a same voltage potential value.

In a more specific implementation, determining whether the voltage potential pattern of the first area corresponds to the expected potential pattern is accomplished by (a) detecting charged particles emitted from the first area in response to the charged particle beam being directed at the first area, (b) generating a target image based on the detected charged particles from the first area, (c) comparing the target image to a reference image that has no defects, (d) determining that the voltage potential pattern of the first area corresponds to the expected potential pattern when a difference between the target image and the reference image is less than a predetermined threshold, and (e) determining that the voltage a difference between the target image and the reference image is not less than the predetermined threshold. In one aspect, the reference image is generated from a design data base which was used to fabricate the test structure. In another aspect, the reference image is generated from a corresponding test structure.

In an alternative embodiment, determining whether the voltage potential pattern of the first area corresponds to the expected potential pattern is accomplished by (a) detecting charged particles emitted from the first area in response to the charged particle beam being directed at the first area, where the detected charged particles have an intensity pattern which corresponds to the voltage potential pattern of the first area, (b) comparing the detected intensity pattern to an expected intensity pattern that corresponds to an area having no defects, (c) determining that the voltage potential pattern of the first area corresponds to the expected potential pattern when a difference between the detected intensity pattern and the expected intensity pattern is less than a predetermined threshold, and (d) determining that the voltage potential pattern of the first area does not correspond to the expected potential pattern when a difference between the detected intensity pattern and the expected intensity pattern is not less than the predetermined threshold.

In a further implementation, localizing the defect when present is accomplished by a) directing a charged particle beam of the tool over a next area of the test structure, b) determining whether a voltage potential pattern of the current area at which the beam is directed corresponds to a current expected potential pattern, wherein the voltage potential pattern of the current area is in response to the charged particle beam directed at the current area, and c) determining that the defect has been located when the voltage potential pattern of the current area does not correspond to a current expected potential pattern. In one within the selected substructure.

In a further aspect, localizing the defect when present is further accomplished by (d) determining that the defect has not been located when the voltage potential pattern of the current area does correspond to the current expected potential pattern, and (e) repeating steps (a) through (d) for a next area of the test structure until it is determined that the defect has been located.

In one specific embodiment, the charged particle beam is directed at the next area by stepping the charged particle tool relative to the test structure from the current area to the next area. The stepping may be accomplished using a binary or a linear search algorithm. In one aspect, determining whether the voltage potential pattern of the current area corresponds to the current expected potential pattern is accomplished by (a) detecting charged particles emitted from the current area in response to the charged particle beam being directed at the current area, where the detected charged particles have an intensity pattern which corresponds to the voltage potential pattern of the current area, (b) comparing the detected intensity pattern of the current area to a current expected intensity pattern that corresponds to an area having no defects, (c) determining that the voltage potential pattern of the current area corresponds to the current expected potential pattern when a difference between the detected intensity pattern of the current area and the current expected intensity pattern is less than a current predetermined threshold, and (d) determining that the voltage potential pattern of the current area does not correspond to the current expected potential pattern when a difference between the detected intensity pattern and the current expected intensity pattern is not less than the current predetermined threshold. In another aspect, determining whether the voltage potential pattern of the current area corresponds to the current expected potential pattern is accomplished by techniques similar to those described above respect to the first area.

In another method embodiment, the invention includes the following operations: (a) in a first direction, scanning a charged particle beam across a first portion of a voltage contrast test structure to determine whether there is a defect present within the voltage contrast test structure, wherein the voltage contrast test structure comprises a plurality of substructures; (b) when a defect is present, determining a selected substructure in which the defect is present based on the first direction scan; and (c) in a same direction as the first direction, scanning the charged particle beam across the selected substructure of the voltage contrast test structure to locate a defect within a voltage contrast test structure without rotating the voltage contrast test structure in relation the charged particle beam. In a preferred embodiment, operations (a) through (c) are accomplished with a same charged particle beam tool. In another aspect, the charged particle beam tool is a scanning type electron beam system.

In another embodiment, the invention pertains to an inspection system for localizing and imaging defects in a semiconductor test structure suitable for voltage contrast inspection. The system includes a beam generator for generating a charged particle beam incident on the test structure, a detector for detecting charged particles from the test structure in response to the charged particle beam, and a controller arranged to perform one or more of the above described method operations.

In another embodiment, the invention pertains to a voltage contrast test structure having a plurality of first substructures. Each first substructure has a first portion that extends into a first area. The first portions are designed to have an expected voltage potential pattern during a voltage contrast inspection of only the first portions so that when the first portions deviate from the expected voltage potential pattern it may be determined that a defect is present within a selected one of the first substructures.

In one implementation, the first area has a size that is less than or equal to a field of view of a charged particle beam based tool. In another implementation, the first substructures and the first portions of the first substructures are arranged so that the first portions may be scanned by a charged particle beam in a first direction to determine whether a defect is present within a selected one of the first substructures and so that the selected first substructure may then be scanned by the charged particle beam in the same first direction to determine a location of a defect within the selected first substructure.

In a specific implementation, the first substructures each form a comb-shaped structure having tines, and the tines of the first substructures are interleaved with the tines of a second substructure that is coupled to a grounding structure. In a further aspect, the first substructures and the second substructure are deposed over a substrate, and the second substructure is coupled with the substrate and the first substructures are not coupled with the substrate.

In another implementation, the first substructures are each adjacent to a second substructure that is coupled to a grounding structure, wherein the first substructures are designed to have a first voltage potential and the second substructures are designed to have a second voltage potential during the voltage contrast inspection. In a further aspect, the first and second substructures together correspond to conductive portions of an SRAM device. In yet another embodiment, the first and second substructures are arranged so that a short between an adjacent first and second substructures results in the adjacent first substructure charging to the second voltage potential instead of the first voltage potential.

In a specific embodiment, each first substructure is designed to have a serpentine shape, and the first portion of each first substructure is a first end of the serpentine shape which has a second end coupled to a grounding structure. In another aspect, each first portion is an end of a corresponding first substructure having an opposite second end coupled to a grounding structure.

In an alternative method embodiment, a charged particle beam is scanned in a first direction across a first portion of a voltage contrast test structure to determine whether there us are defects present within the voltage contrast test structure. The voltage contrast test structure has a plurality of substructures. When a defect is present, a selected substructure in which the defect is present is determined based on the first direction scan. In a same direction as the first direction, the charged particle beam is scanned across the selected substructure of the voltage contrast test structure to locate a defect within a voltage contrast test structure without rotating the voltage contrast test structure in relation the charged particle beam;

These and other features and advantages of the present invention will be presented in more detail in the following specification of the invention and the accompanying figures which illustrate by way of example the principles of the invention.

DETAILED DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In one embodiment, the techniques of the present invention may be implemented within a single e-beam system, such as an e-beam step and repeat system. For instance, defects are found and localized and a high resolution image is generated of the defects within the same step and repeat e-beam system. In another embodiment, defects are detected and located on a test structure with a charged particle beam without rotating the test structure with respect to the charged particle beam, such as via a scanning type e-beam system. That is, it is determined whether defects are present and any present defects are then located without rotating the test structure relative to the e-beam column.

Figure 2A:
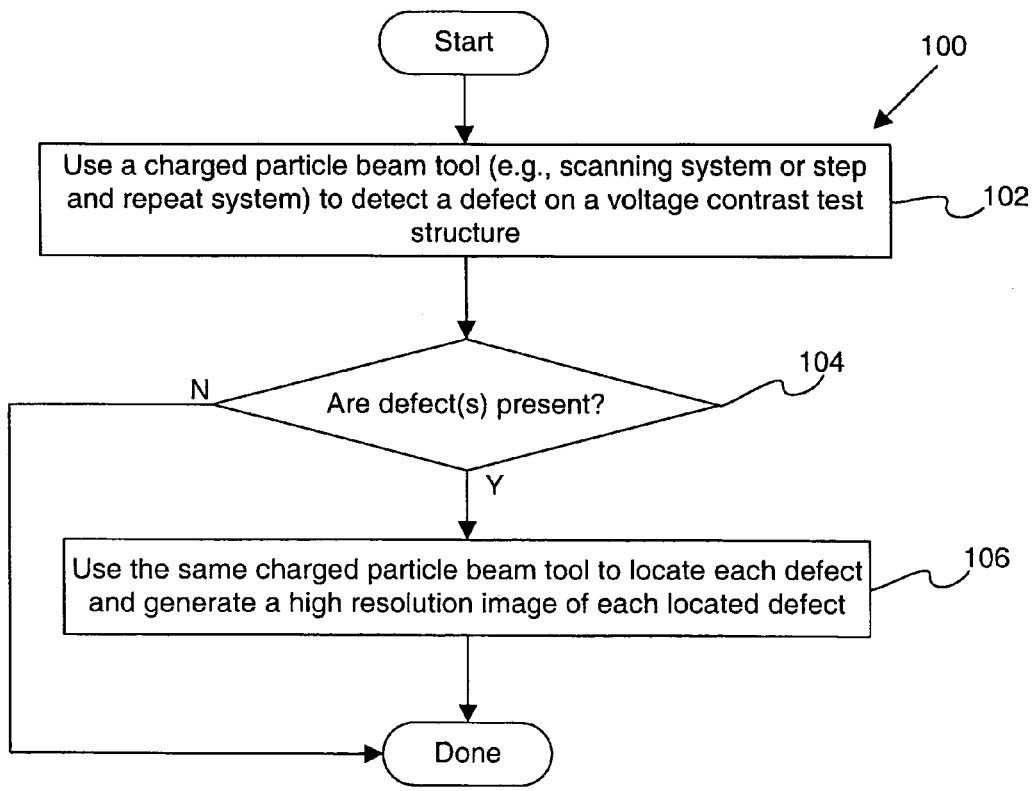
FIG. 2A is a flowchart illustrating a procedure for inspecting a test structure using a charged particle system in accordance with one embodiment of the present invention.

FIG. 2A is a flowchart illustrating a procedure 200 for inspecting a test structure using a single charged particle system in accordance with one embodiment of the present invention. Typically, the charged particle beam system implements an electron beam (e-beam). Accordingly, the improved techniques and test structures of the present invention are described herein with respect to an e-beam based system although any other type of charged particle beam system may be utilized, such as a focused ion beam tool.

Initially, a charged particle beam tool is used to detect or identify defects on a voltage contrast test structure in operation 102. One example implementation of a defect detection procedure is described further below with respect to FIG. 3. After the charged particle beam tool is used to detect or identify defects in the test structure, it is then determined whether there are any defects present in operation 104. If there are no defects present, the procedure ends. If there are defects present, the same charged particle beam tool is then used to locate each defect and generate a high resolution image of each located defect in operation 106. A high resolution image is defined as having a resolution of at least about 0.04 µm (or equal to or greater than 0.01 µm). One example implementation of a procedure for localizing and imaging a defect is further described below with reference to FIG. 4.

Figure 1:
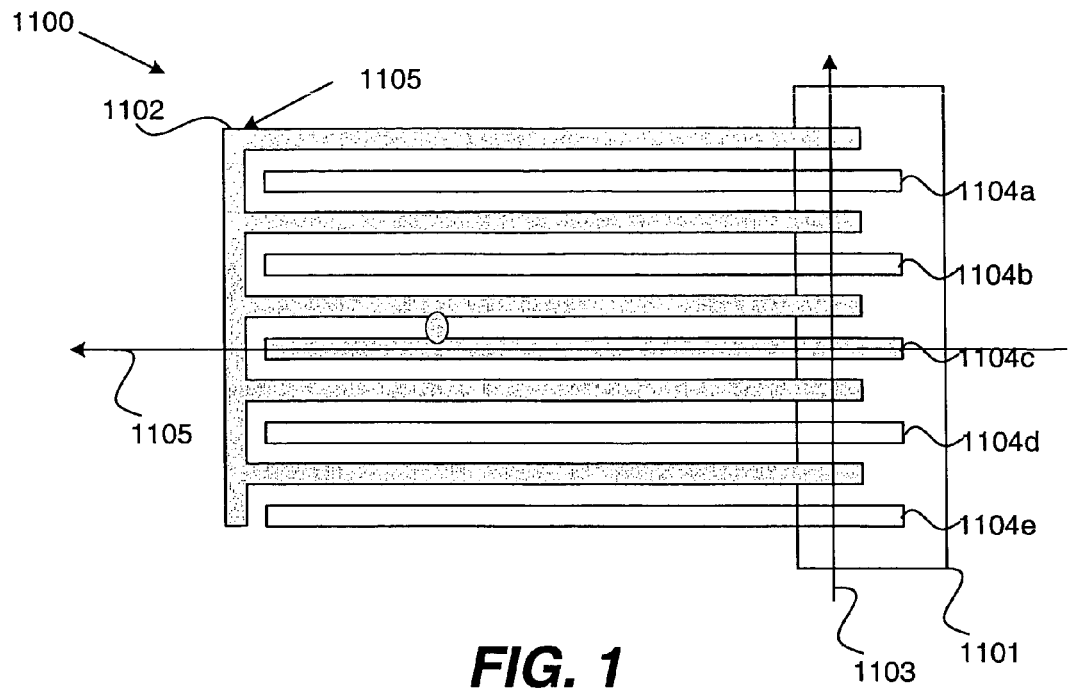
FIG. 1 is a diagrammatic top view representation of a typical voltage contrast type test structure.
Figure 3:
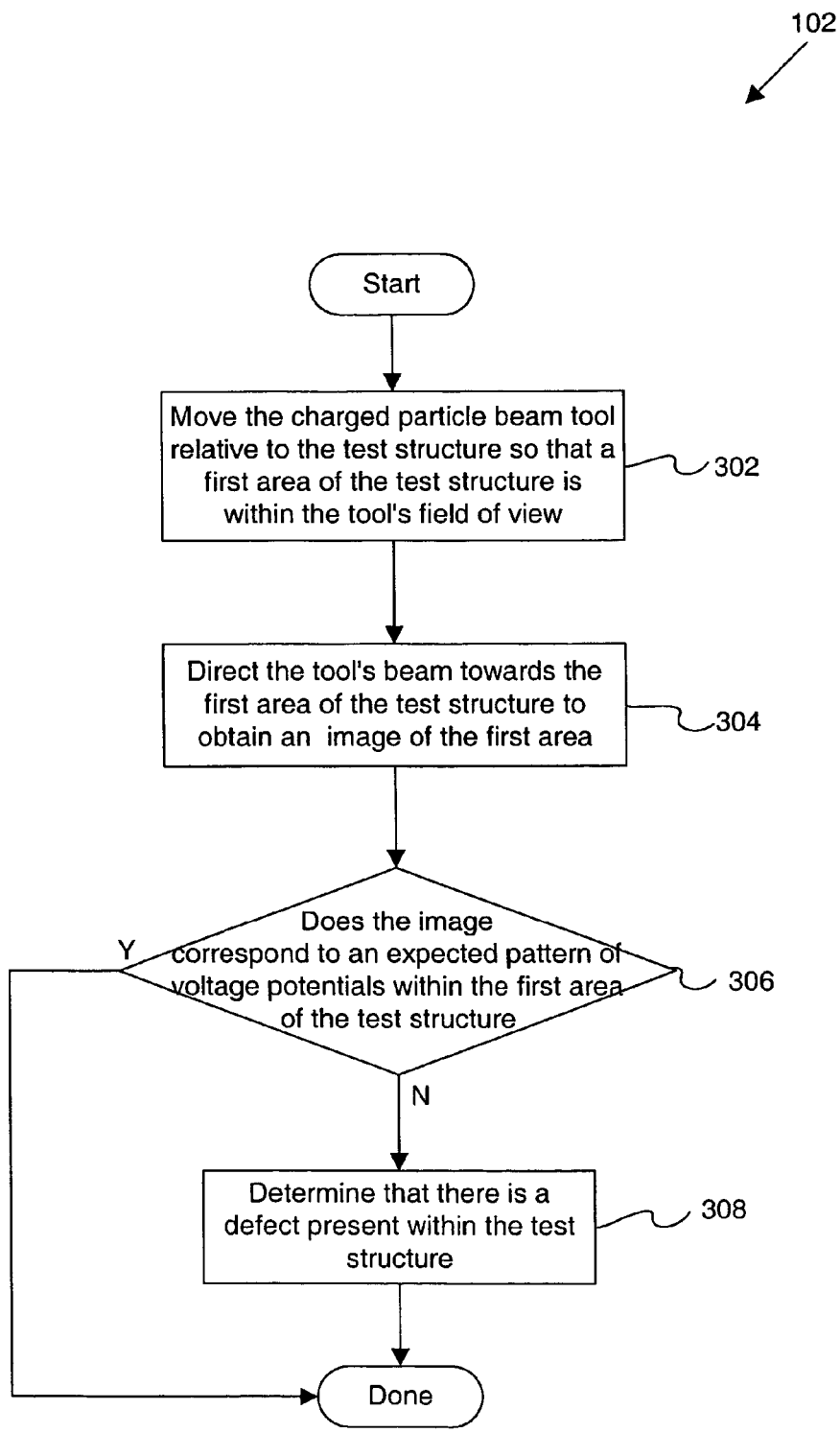
FIG. 3 is a flowchart illustrating the operation of FIG. 1 for detecting the presence of a defect in accordance with one embodiment of the present invention.
Figure 4:
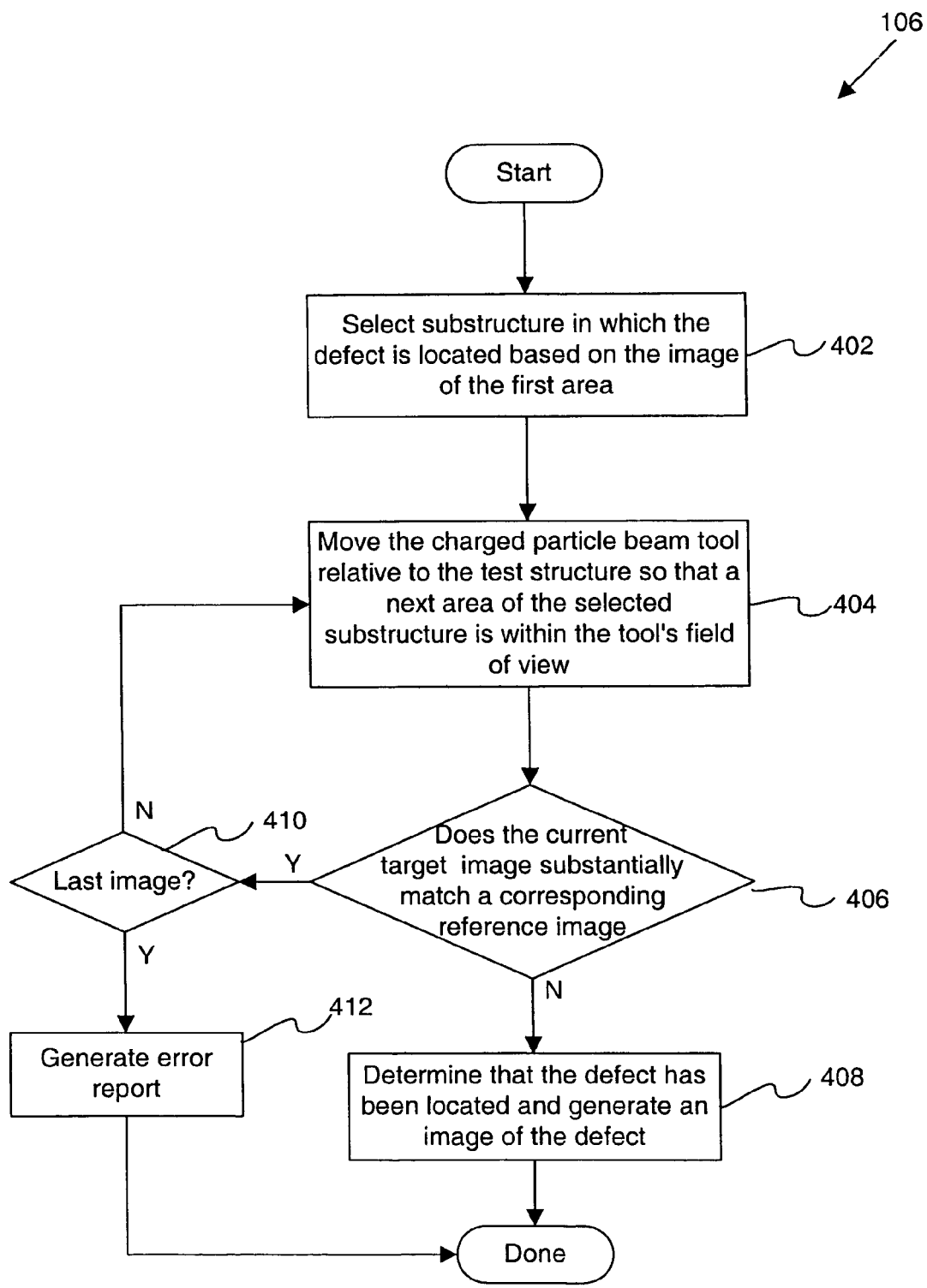
FIG. 4 is a flowchart illustrating the operation of FIG. 1 for localizing a detected defect and generating an image of the localized defect in accordance with one embodiment of the present invention.

The techniques of the present invention may be applied to any type of voltage contrast test structure that allows rapid detection, localization, and high resolution imaging of defects on such test structure using a same charged particle based tool or allows rapid detection and localization of defects without rotating the test structure. In one embodiment, the test structure has an area that can be inspected within a single field of view of the charged particle beam tool, such as a step and repeat type system, to determine whether defects are present within the entire test structure. This area is referred herein as an "initial field of view area." Several example test structure embodiments are illustrated in FIGS. 2B and 5–10. However, these test structures are merely illustrative and are not meant to limit the scope of the invention. The test structures of FIGS. 2B and 5–10 are described below in conjunction with the example defect detection, localization, and high resolution imaging techniques illustrated in FIGS. 3 and 4. FIG. 3 is a flowchart illustrating the operation 102 of FIG. 1 of detecting the presence of a defect in accordance with one embodiment of the present invention. FIG. 4 is a flowchart illustrating the operation 106 of FIG. 1 of locating and imaging a found defect in accordance with one embodiment of the present invention.

Figure 2B:
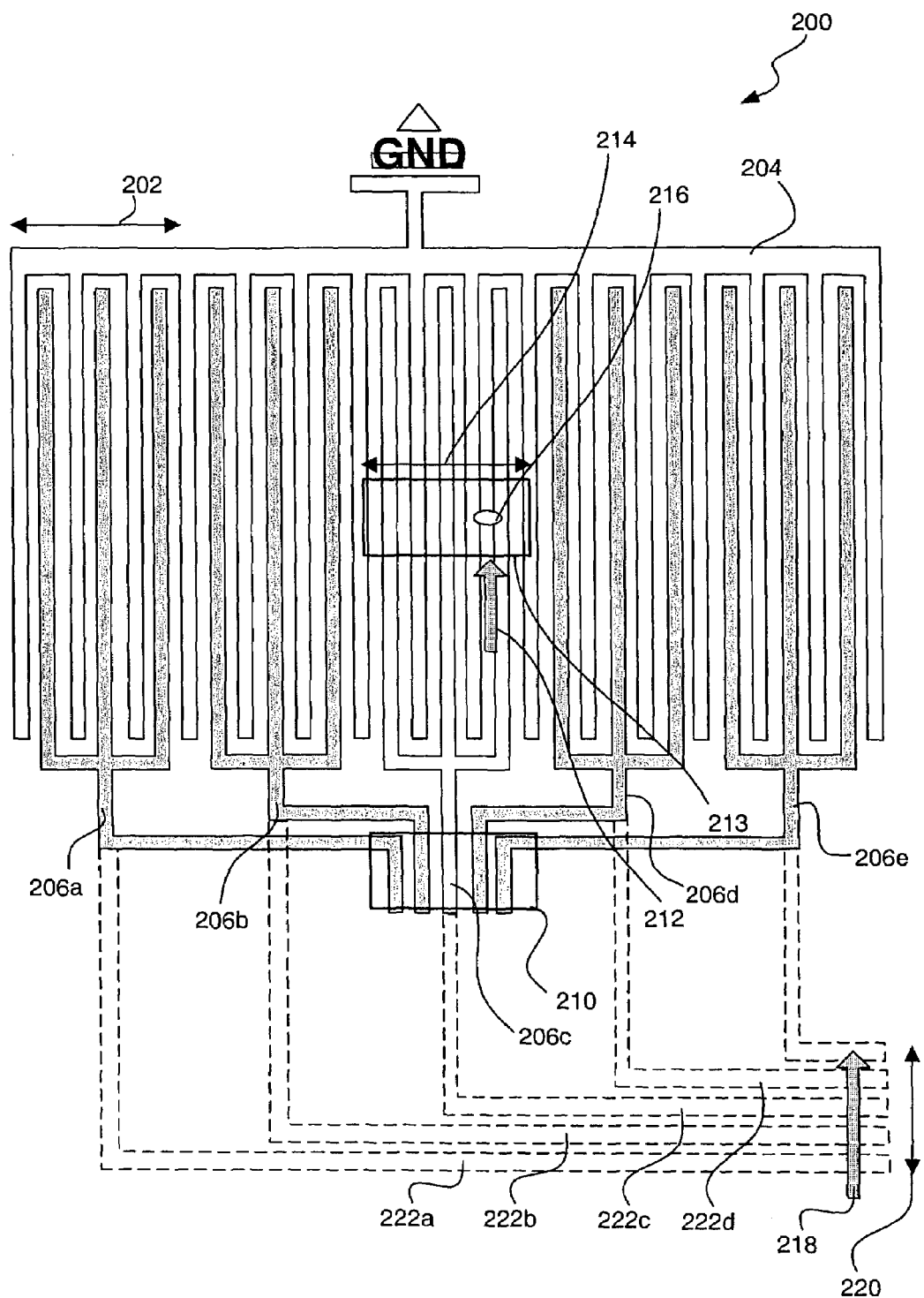
FIG. 2B is a diagrammatic top view representation of a test structure suitable for localizing shorts in accordance with a first embodiment of the present invention.

FIG. 2B is a diagrammatic top view of an example test structure for localizing shorts in accordance with a first embodiment of the present invention. As shown, the test structure 200 includes a first conductive substructure 204 having a comb shape. The first substructure 204 is designed to charge to a first voltage potential or brightness level during a voltage contrast inspection. In the illustrated embodiment, the first substructure 204 is coupled to a grounding structure or to a pseudo ground, e.g., the substrate or a relatively large conductive structure (not shown) that will cause the first substructure 204 to charge similarly as if it were coupled to the substrate. A plurality of second conductive substructures having comb shapes 206 are each left floating. The tines of the second substructures 206 are interleaved between the tines of the first substructure 204.

In the illustrated embodiment, each second substructure 206 has a portion which extends into an area 210 small enough to fit within the field of view of a particular charged particle beam based tool, such as an e-beam step and repeat system. This field of view area 210 is the area that is inspected first during a voltage contrast inspection. One end of each floating substructure 206a through 206e extends within field of view area 210. Of course, any suitable portion may extend into such field of view area 210. In a step and repeat system there is a specific number of pixels that are present in an image taken by the system. For example, an eV300 SEM review tool available from KLA-Tencor of San Jose, Calif. has 640 pixels available in the x dimension and 480 pixels available in the y dimension. The size of the field of view is determined by the resolution required for each pixel. The size of the image is number of pixels multiplied by the pixel size.

In the defect detection procedure 102 of FIG. 3, the charged particle beam tool may be moved relative to the test structure so that a first area of the test structure is within the tool's field of view in operation 302. The tool's beam is then directed towards the first area of the test structure to obtain an image of the first area in operation 304. In general terms, the charged particle beam is directed towards this first area of the test structure so as to produce a pattern of voltage potentials or charge levels on structures within the first area.

When the first area is sized to fit within the field of view of a step and repeat type system, the e-beam may be rastered over the first area within the field of view for such system. In an alternative embodiment designed for inspection with a scanning type system, the first area may be any size since the e-beam "scans" across the first area. Preferably in this embodiment, the first area has a width equal to the swath size of the e-beam's raster pattern width. In either case, the e-beam is directed towards the first area so as to charge the entire test structure. In the scanning application, this may be accomplished by increasing the e-beam dwell time on the first area until the entire test structure is charged or by frame averaging. In the step and repeat application, a sufficient dwell time or current charge may be selected for the e-beam so as to charge the entire test structure.

These differently charged structures in the first area emit different intensities of secondary and/or backscattered electrons. The charged particle beam tool then detects the secondary and/or backscattered electrons emitted from the scanned first area and can then generate an image having brightness levels corresponding to the different voltage potentials. Referring to the test structure of FIG. 2B, area 210 may be initially inspected by the charged particle beam tool to obtain an image (or intensity values) of the substructures 208.

It is then determined whether the image of the first area corresponds to an expected pattern of voltage potentials in operation 306. Alternatively, the intensity of the detected secondary and/or backscattered electrons from various portions of the first area are analyzed directly without generation of an image. If the image (or intensity values) from the first area corresponds to the expected pattern, the defect detection procedure 102 ends. However, if the image (or intensity values) does not correspond to the expected pattern, it is then determined that there is a defect present within the test structure in operation 308.

By way of example, the substructure portions 208 within area 210 are expected to have a same voltage potential during the voltage contrast inspection. Thus, when a substructure portion 206 deviates in intensity from the other substructure portions, it may be determined that the deviating substructure has a defect present therein. As shown, substructure 206c has a different intensity than the other substructures 206a, 206b, 206d and 206e. Thus, it may be determined that a defect is present within the test structure of FIG. 2B as a whole, as well as determining that a defect is specifically located within substructure 206c.

The image from the first area of the test structure (herein referred to as a "target image") may be compared to a reference image (or the electron intensities can be compared to reference intensities) to determine whether a defect is present within the test structure. The reference image (or reference intensities) may be generated from the design data that was used to fabricate the test structure or may be obtained from an adjacent die, and adjacent test structure, or an adjacent portion of the same test structure. When the target image from the first area of the test structure fails to substantially match the reference image or the detected electron intensities from the first area fail to substantially match the reference intensities, it may be determined that a defect is present within the test structure. For example, when the difference between the target image (or target intensity values) and reference image (or reference intensity values) is greater than a predetermined threshold, it is determined that a defect is present. Otherwise, it is determined that there is no defect. That is, when the target image (or target intensity values) and the reference image (or reference intensity values) match, it is determined that there is no defect present.

After a defect is initially detected within a test structure, the identified defect may then be localized and imaged according to the techniques illustrated in FIG. 4. After a defect is detected by inspecting the first area of the test structure, a substructure in which the defect is located may be selected based on the image (or intensity pattern) of the first area in operation 402. For the test structure of FIG. 2B, substructure 206c is selected since it was determined to contain a defect based on its different potential (as compared with the other substructure 206a and 206c–206e) during the voltage contrast inspection of area 210. This step is optional and depends on the particular configuration of the test structure. That is, the test structure may not be suitable for determining which substructure has a defect by inspection of a first area of the test structure.

The charged particle beam tool is then moved relative to the test structure so that a next area of the selected substructure is within the tools field of view in operation 404. When using a step and repeat e-beam system, the sample is stepped relative to the e-beam column so that a next area is placed under the e-beam column. When a scanning e-beam system is used, the sample is rotated and the e-beam is then scanned over the selected substructure. Alternative test structure embodiments which do not require rotation of the sample relative to the e-beam are further described below.

It is then determined whether the current target image substantially matches a corresponding reference image or reference intensity pattern in operation 406. In other words, it is determined whether the current area under inspection is defect-free. If there is a match, it is then determined whether this is the last image in operation 410. If this is the last image, an error report may be generated in operation 412. If this is not the last image, the charged particle beam tool may then be moved relative to the test structure so that a next area of the selected substructure is within the tools field of view in operation 404 and the remaining operations repeat. When a step and repeat system is used, the sample is stepped relative to the e-beam so that a next area is under the e-beam. In contrast, when a scan system is used, the e-beam is simply scanned to a new next area. When a current target image does not substantially match a corresponding reference image or expected voltage potential pattern, it is then determined that the defect has been located and an image of the defect may be generated in operation 408.

Referring back to FIG. 2B, the charged particle beam tool may be used to scan or step across portions of the substructure having the defect which are outside the initially inspected area 210. As shown, the beam is moved or stepped in direction 212 along substructure 206c until field of view area 113 is reached which contains the defect 216. In the illustrated embodiment of FIG. 2B, the defect is in the form of a short between the substructure 206c and the grounded comb structure 204. In this example, a reference image which corresponds to area 113 and contains no short defect is compared to the image in field of view area 113. This comparison results in a difference corresponding to the short type defect. Since this difference is significant, e.g., has a size greater than a predetermined threshold, it is determined that this difference corresponds to a defect.

If a step and repeat charged particle system is used, each substructure 206 preferably has a width 214 that fits within the field of view width (e.g., 213) of the charged particle beam tool. Otherwise, this width may be any suitable value, for example, when a scanning charged particle tool is used. An alternative embodiment of the test structure suitable for a scanning tool is shown by dashed lines in FIG. 2B. In this alternative implementation, portions 222a through 222d extend horizontally from each substructure so that these portions may be scanned in a same direction as a selected substructure, rather than extending into field of view area 210. The height 220 of this initial scan area may be any suitable value and is not limited by the field of view of the inspection tool.

Using a scanning tool, the ends (or any other scan region) of substructure portions 222 may be initially scanned by a charged particle beam in direction 218 to determine whether a defect is present within one of the substructures. In charged particle scanning system implementation, the charged particle beam is deflected in a first direction across the substructures' end portions 222 while the test structure is moved in a second direction that is orthogonal to the first direction so as to raster across the substructure end portions in direction 218, for example. When a defect is present, a selected substructure such as 206d may then be scanned with the charged particle beam to locate the defect. This implementation allows one to locate a defect without rotating the test structure relative to the charged particle beam. In this embodiment, the located defect may then be imaged using a high resolution charged particle beam tool, such as a step and repeat tool.

The portions of the test structure which are located within the initial scan area (e.g., 222) may have a different size and/or shape than the test structure portions which are outside this initial scan area. This variance may be desired for any number of reasons. For example, the test portions within the initial scan area may be sized to facilitate image processing, while the test portions outside the initial scan area are sized to correspond to design rules. For instance, the test portions within the initial scan area may be larger so as to allow higher e-beam currents and a reduced charging time for the test structure. In another application, the test portions within the initial scan area have sizes and/or shapes which vary and correspond to different types of substructures so as to allow one to determine which substructure has a defect based on the size and shape of the defective test portion within the initial scan area. Any of the test structures further described below may also have such variance in their test portions located within the initial scan area.

Figure 5:
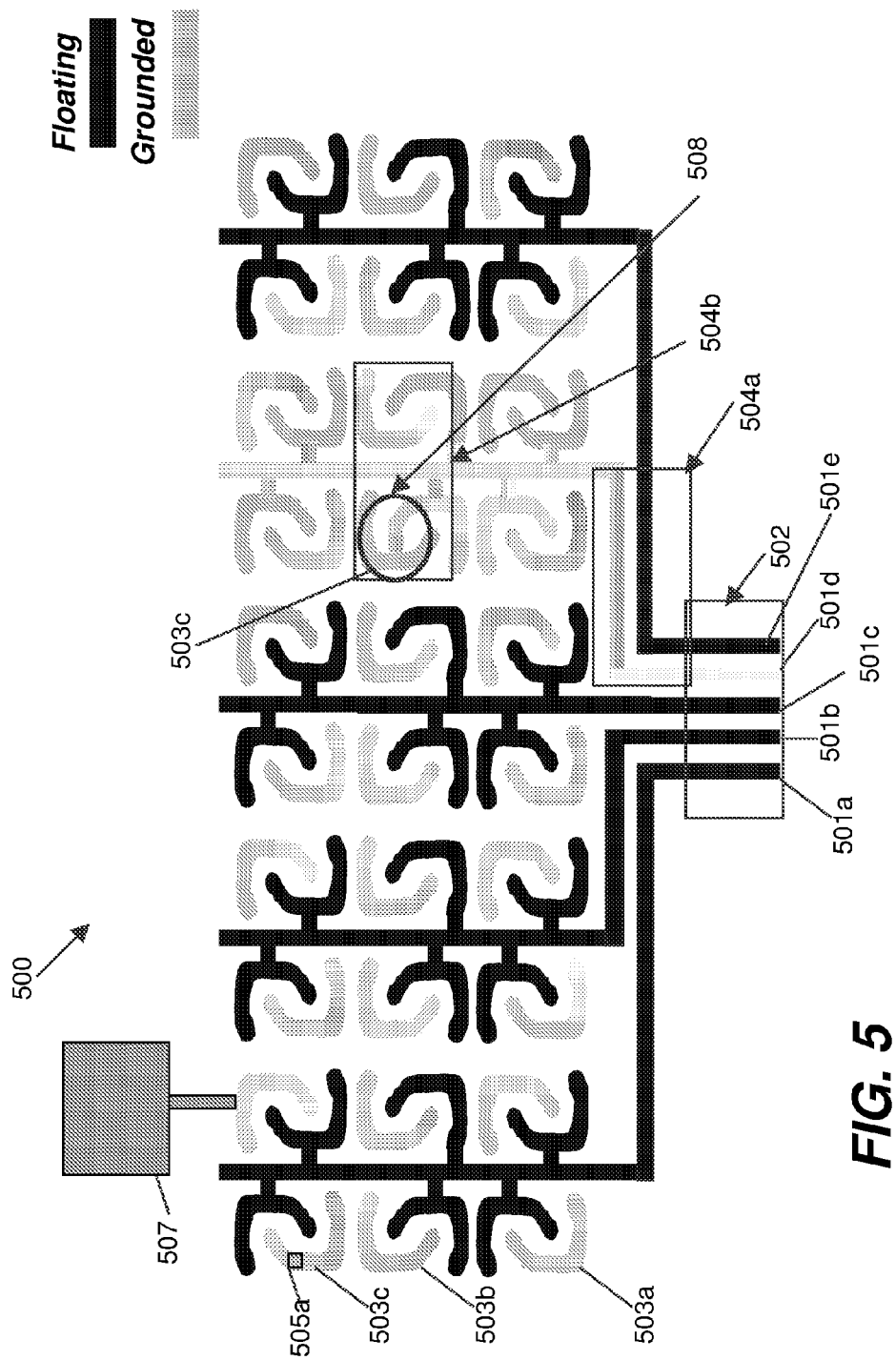
FIG. 5 is a diagrammatic top view representation of a test structure in accordance with a second embodiment of the present invention.

The techniques of the present invention may be practiced on other types of test structures, besides the comb type test structure for finding shorts of FIG. 2B. FIG. 5 is a diagrammatic top view representation of a test structure 500 in accordance with a second embodiment of the present invention. This test structure 500 is designed to mimic a portion of an SRAM device and is designed to detect the presence of shorts using the techniques described above. Similar to the test structure of FIG. 2B, this SRAM type test structure 500 includes a plurality of substructures 501a through 501e. Each substructure 501 is adjacent to a plurality of other substructures 503 (e.g., 503a and 503b) which are coupled to the substrate through conductive vias (e.g., via 505a), while the substructures 501 remain floating and not coupled with the substrate.

Alternatively, the adjacent "grounded" substructures 503 may be coupled to a large structure, such as a large probe pad 507, so that the grounded substructures charge differently than the floating substructures. In other words, the large structure may serve as a pseudo ground for one or more substructures 503. Any of the test structures described herein as having substructures coupled with the substrate may alternatively be coupled with a relatively large structure, such as a probe pad. Several embodiments of test structures having substructures coupled with a relatively large conductive structure which serves as a pseudo ground, instead of coupling to the substrate, are described further in U.S. patent application Ser. No. 10/265,051, filed 2 Oct. 2002 which application is incorporated herein by reference in its entirety.

Each substructure 501 also has a portion which extends into an initial field of view area 502. The test structure may be inspected for shorts between substructures 501 and 503 by scanning an e-beam across field of view 502. A short type defect in test structure 500 is identified when the portions of the substructures 501 within the initial field of view area 502 have an unexpected intensity pattern. In the illustrated embodiment, when a substructure is floating, it appears dark during the e-beam scan. In contrast, when a substructure becomes grounded by being shorted to an adjacent grounded substructure, it appears bright during the e-beam scan. As shown, substructures 501a–501c and 501e remain floating and appear dark, while substructure 501c appears bright due to a short defect 508 to substructure 503c.

The short defect 508 may be located by moving the e-beam along the defective substructure 501c. When using a step and repeat system, the e-beam column is stepped relative to the sample from area to area so as to sequentially image different areas. As shown, the e-beam next scans field of view area 504a. The e-beam continues to move or step over the defective substructure 501c until the short defect is located within the field of view. In other words, the field of view of the e-beam moves or steps over the defective substructure 501c until the defect is located within a particular field of view area. As shown, the short defect 508 is located within the field of view area 504b. A high resolution image of the located defect 508 is then generated.

Figure 6:
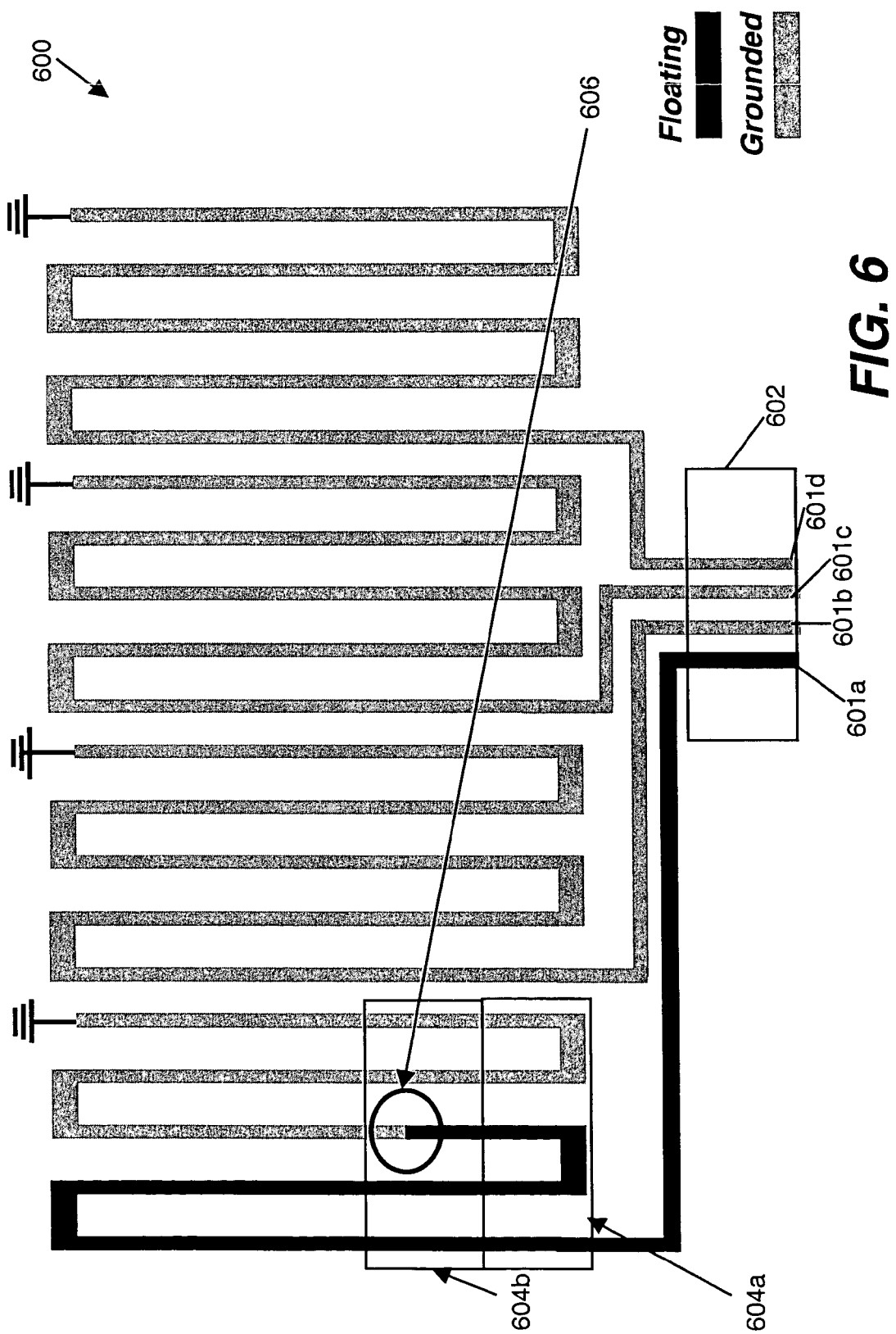
FIG. 6 is a diagrammatic top view representation of a test structure in accordance with a third embodiment of the present invention.

A test structure may alternatively be designed to facilitate detection of open type defects. FIG. 6 is a diagrammatic top view representation of a test structure 600 in accordance with a third embodiment of the present invention. This test structure 600 includes a plurality of substructures 601a through 601d. Each substructure is designed so that a first end extends into initial field of view area 602, while a second end is coupled to ground.

An e-beam may initially be scanned over the first ends in field of view area 602 to detect open type defects in substructures 601. In this embodiment, the substructures will appear bright when coupled to ground and dark. However, a substructure's first end (which is opposite the grounded second end) will appear bright when there is an open defect which decouples the first end from ground. As shown, substructure 601a has an open defect 606 and its first end appears dark in field of view area 602. The open defect 606 is found by moving or stepping the e-beam over substructure 601a until the open defect is identified within a particular field of view area. As shown, field of view area 604a does not contain the open defect, while field of view area 604b has the open defect. Thus, the open defect's location is identified as being within field of view area 604b. The defect's exact location may be determined by comparing the image (or intensity value pattern) within field of view area 604b to a corresponding reference image (or intensity pattern). A high resolution image of the located defect 606 is then generated.

Figure 7A:
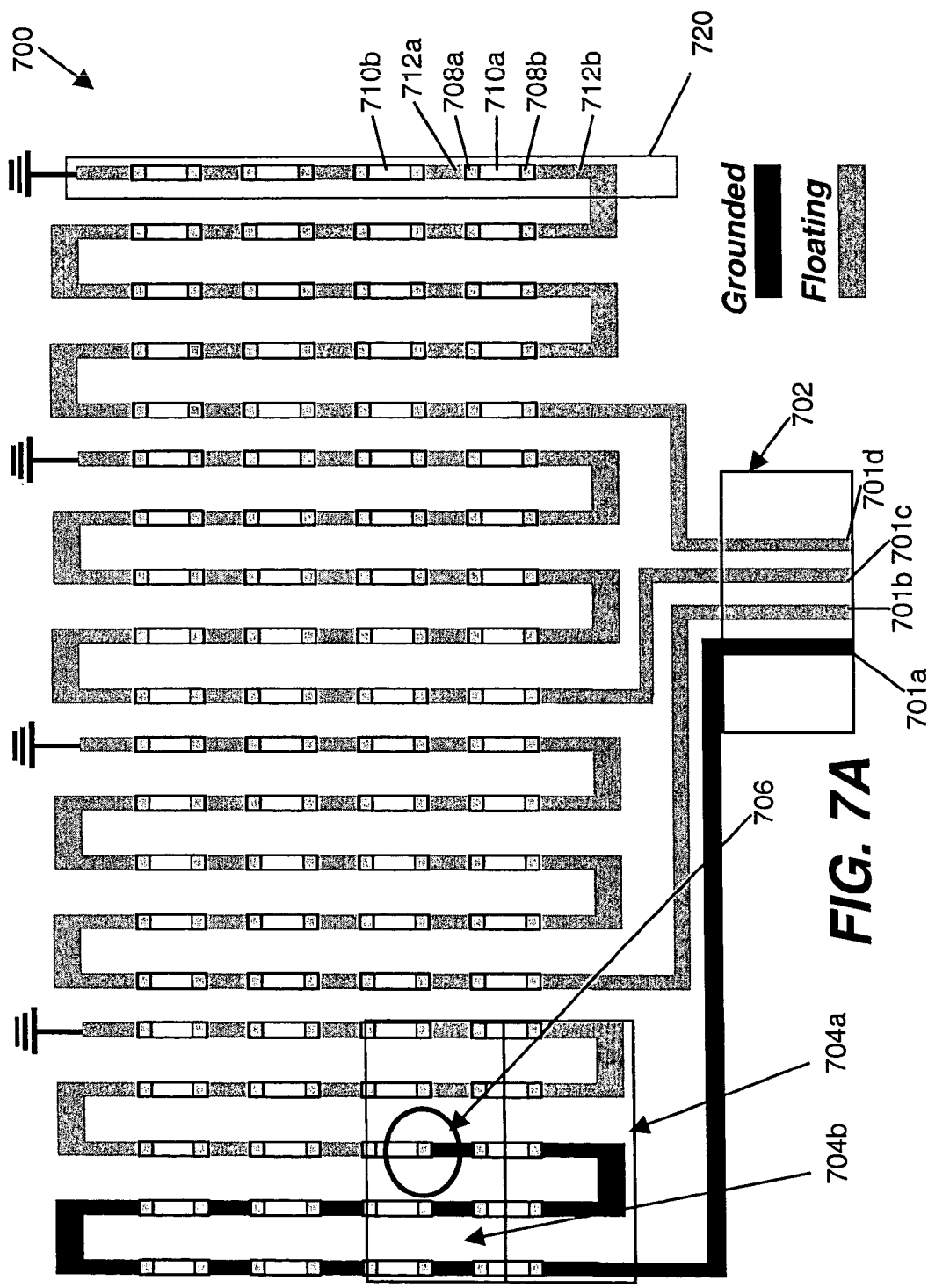
FIG. 7A is a diagrammatic top view representation of a test structure in accordance with a fourth embodiment of the present invention.

FIG. 7A is a diagrammatic top view representation of a test structure 700 in accordance with a fourth embodiment of the present invention. This test structure 700 is also designed for capture of open type defects during a voltage contrast inspection. As shown, test structure 700 includes a plurality of substructures 701a through 701d. The test structure 700 is similar to the structure 600 of FIG. 6 in that one end of each substructure 701 is coupled to the substrate or to a pseudo ground and the opposite end extends into an initial field of view area 702. However, each substructure 601 is in the form of a via chain which includes two different conductive layers coupled together by vias. To illustrate a portion of the chain, area 720 includes a plurality of lower conductive portions 712, a plurality of vias 708, and a plurality of upper conductive layers 710.

Figure 7B:
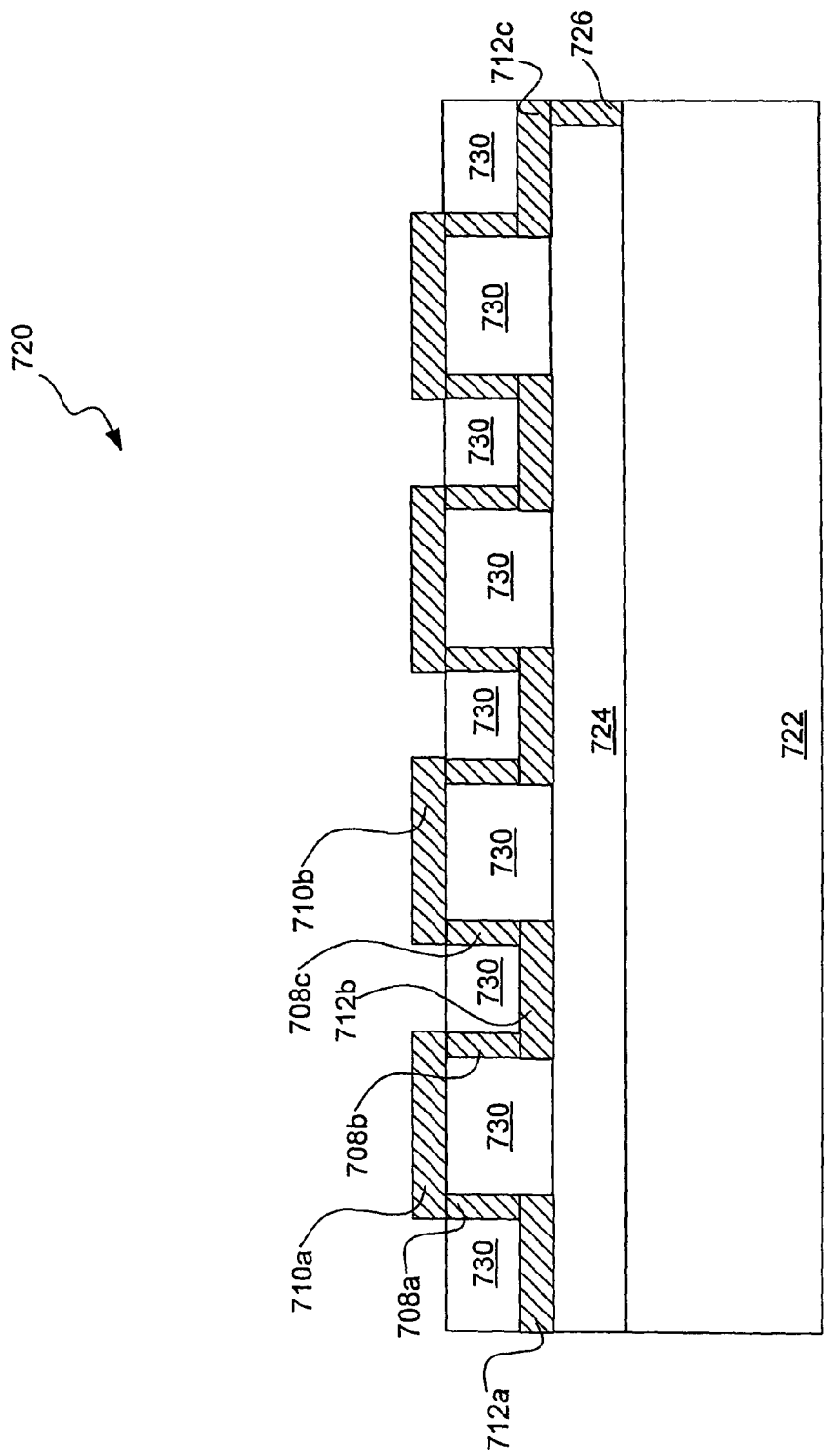
FIG. 7B shows a diagrammatic cross section view of a portion of the test structure of FIG. 7A.

FIG. 7B shows a cross section view of area 720 of FIG. 7A. As shown, a dielectric layer 724 is formed over a substrate 722. A plurality of lower conductive portions 712 are formed over the dielectric layer 724. A second dielectric layer 730 is formed over the lower conductive portions 712, while a plurality of conductive plugs or vias 708 are formed within the second dielectric layer. A plurality of upper portions 710 are then formed over the second dielectric layer 730. Of course, any suitable number and type of layers may be formed between the lower conductive layer 712 and the substrate 722 and/or between the lower conductive layer 712 and the upper conductive layer 710.

Each end of each upper portion 710 is coupled to a via 708 so that a chain is formed from the lower conductive portions, vias, and upper conductive portions. As shown, lower conductive portion 712a is coupled to upper conductive portion 710a through via 708a. This upper portion is then coupled with lower portion 712b through via 708b. Likewise, this lower conductive portion 712b is coupled with upper conductive portion 710b through via 708c. Thus, a "via chain" is formed. As shown, the end of this via chain is coupled to the substrate 722 through via 726.

The via chains or substructures 701 may be inspected for open defects by inspecting the first ends of each substructure

701 that extend into field of view area 702 with an e-beam. Since the substructures are designed to be coupled at the second ends to the substrate, all of the first ends of the substructures 701 are expected to have a same intensity and brightness level. However, when one of the substructures 701 becomes decoupled from the substrate because of an open defect, the defective substructure's end within the initial field of view 702 will have a different intensity or brightness level from the other substructure ends within the same field of view 702. As shown, substructure 701*a* has an open defect 706 and, as a result, the defective substructure 701*a* has a dark appearance, while the other substructures 701*b* through 701*d* have a bright appearance. The open defect 706 may then be located by continuously scanning or stepping over the defective substructure (e.g., by inspecting new field of view areas 704*a* and 704*b*) until the defect is found. As shown, the open defect is found in field of view area 704*b*. A high resolution image of the located defect 706 is then generated.

Similar to the alternative test structure of FIG. 4B, the test structures of FIGS. 5, 6, and 7A may be modified to so that each substructure has portions which extend in a direction that is orthogonal to the long axis of each substructure, rather than extending in a parallel direction to such axis such as in the illustrated embodiments. This arrangement allows a defect to be found by initially scanning across the end portions and then continuing to scan in a same direction over the defective substructure without rotating the test structure relative to the charged particle beam. A high resolution may then be generated using any suitable charged particle system, such as a step and repeat system.

Figure 8:
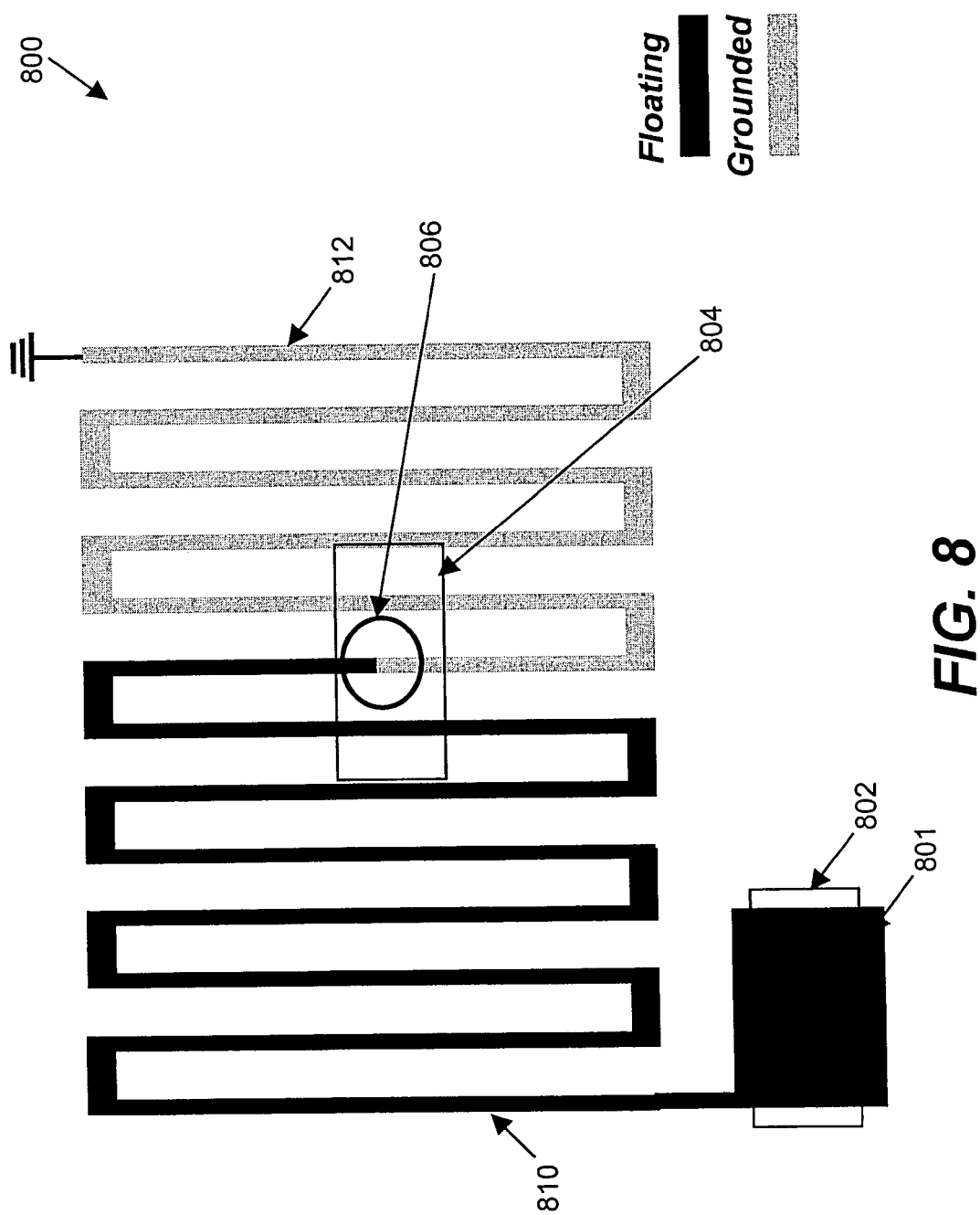
FIG. 8 is a diagrammatic top view representation of a test structure in accordance with a fifth embodiment of the present invention.

When using a step and repeat type system, one may perform a stepping type search, such as a binary or linear search, to locate a defect in a defective substructures. That is, the e-beam may be efficiently stepped over one of the defective substructures of FIGS. 2, 5, 6, and 7A. Also, when a test structures is formed from a single piece (rather than a plurality of substructures as in FIGS. 2, 5, 6, and 7A), the e-beam may be stepped across the entire test structure to locate a defect when it is determined that the test structure is defective. FIG. 8 is a diagrammatic top view representation of a test structure 800 in accordance with a fifth embodiment of the present invention. This test structure 800 is formed from a single serpentine-shape conductive structure although any suitable shape may be utilized. A first end of the test structure 800 has an conductive pad 801, while the opposite second end is coupled to ground (e.g., the substrate).

The first end may be any suitable shape that may be inspected during a voltage contrast inspection to detect defects within the test structure. That is, the first end may have the same width as the rest of the test structure 800. However, the size of the first end is sized such that if there is an open defect within the test structure 800, the first end (which is now floating) has a different intensity or brightness level than the grounded end.

An e-beam may be scanned over the first end to determine whether a defect is present somewhere within the test structure 800. As shown, field of view area 802 is initially scanned with an e-beam to determine whether the first end 801 has an expected intensity or brightness level. Since the illustrated test structure has an open defect 806, the first end has a different intensity than expected. That is, the first end 801 has a different brightness level than the portion of the test structure that is still coupled to ground. As shown, test structure portion 810 is left floating, while portion 812 is left grounded as a result of the open defect 806.

When a defect is initially detected in test structure 800, a stepping type search may then be used to locate the open defect. For example, the second end of the test structure may be inspected with the e-beam. An area halfway between the first end and the second end may then be inspected to locate the open defect 806. If the defect is not found at the halfway point, the e-beam may then be moved to an area that is halfway between the first end (or the second end) and the halfway point of the test structure. The direction of the search depends on whether the inspected area has an expected brightness level or not. For instance, when the halfway point has an expected brightness level, it may be determined that the defect lies between the first end and the halfway point so the e-beam is moved accordingly. Several stepping type inspection techniques are described within U.S. patent application Ser. No. 10/264,625, filed 2 Oct. 2002, which application is incorporated herein by reference in its entirety. A high resolution image of the located defect 806 is then generated.

Figure 9:
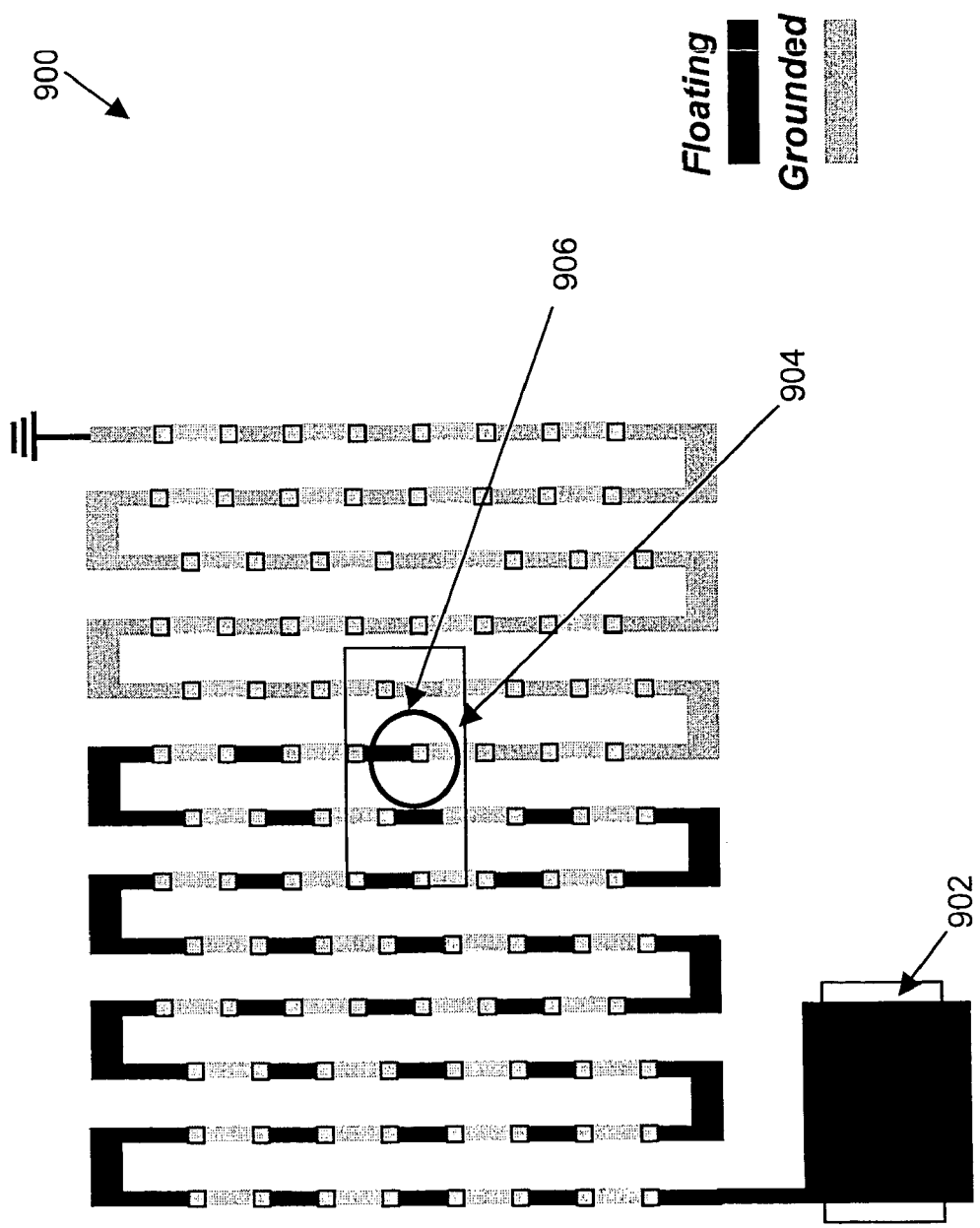
FIG. 9 is a diagrammatic top view representation of a test structure in accordance with a sixth embodiment of the present invention.

FIG. 9 is a diagrammatic top view representation of a test structure 900 in accordance with a sixth embodiment of the present invention. Similar to the test structure 800 of FIG. 8, the test structure 900 of FIG. 9 is formed without substructures. As shown, the test structure 900 forms a via chain (similar to the via chain described above with respect to FIGS. 7A and 7B). A first end of the via chain 900 extends into an initial field of view area 902, while the opposite second end is coupled to the substrate or ground.

The initial field of view area 902 is inspected with an e-beam to determine whether the test structure 900 has an open defect. When the first end has an unexpected intensity or brightness level, it may be determined that the test structure 900 has an open defect. Since the test structure 900 has an open defect 906, the first end has a dark appearance and the second end has a bright appearance. A binary or linear search (or other type of stepping search) with the e-beam, may then be performed to locate the open defect 906. For instance, the e-beam is stepped across the via chain test structure 900 until the transition point is found. A high resolution image of the located defect 906 is then generated.

Figure 10:
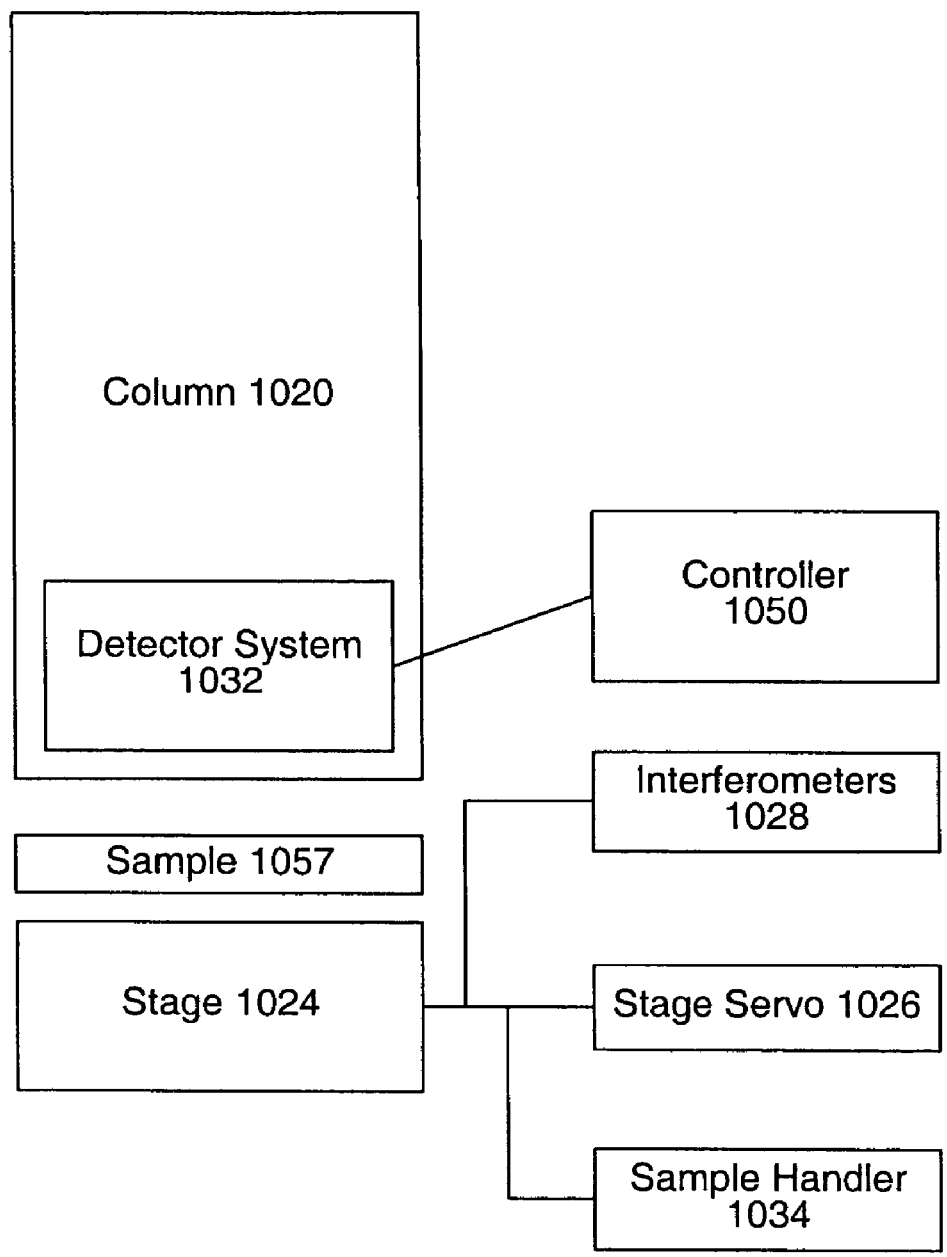
FIG. 10 is a diagrammatic representation of a charged particle system in which the techniques of the present invention may be implemented.

FIG. 10 is a diagrammatic representation of a charged particle system in which the techniques of the present invention may be implemented. The detail in FIG. 10 is provided for illustrative purposes. One skilled in the art would understand that variations to the system shown in FIG. 10 fall within the scope of the present invention. For example, FIG. 10 shows the operation of a particle beam with a continuously moving stage. However, the test structures and product structures and many of the inspection techniques described herein are also useful in the context of other testing devices, including particle beams operated in step and repeat mode. As an alternative to moving the stage with respect to the beam, the beam may be moved by deflecting the field of view with an electromagnetic lens. Alternatively, the beam column to be moved with respect to the stage.

Sample 1057 can be secured automatically beneath a particle beam 1020. The particle beam 1020 can be a particle beam such as an electron beam. The sample handler 1034 can be configured to automatically orient the sample on stage 1024. The stage 1024 can be configured to have six degrees of freedom including movement and rotation along the x-axis, y-axis, and z-axis. In one embodiment, the stage 1024 is aligned relative to the particle beam 1020 so that the x-directional motion of the stage is corresponds to an axis that is perpendicular to a longitudinal axis of inspected conductive lines. Fine alignment of the sample can be achieved automatically or with the assistance of a system operator. The position and movement of stage 1024 during the analysis of sample 1057 can be controlled by stage servo 1026 and interferometers 1028.

While the stage 1024 is moving in the x-direction, the inducer 1020 can be repeatedly deflected back and forth in the y direction. According to various embodiments, the inducer 1020 is moving back and forth at approximately 100 kHz. According to a preferred embodiment, the stage 1024 is grounded to thereby ground the substrate and any structure tied to the substrate (e.g., source and drains) to allow voltage contrast between the floating and grounded structures as the result of scanning the targeted features.

A detector 1032 can also be aligned alongside the particle beam 1020 to allow further defect detection capabilities. The detector 1032 as well as other elements can be controlled using a controller 1050. Controller 1050 may include a variety of processors, storage elements, and input and output devices. The controller may be configured to implement the defect detection, location and imaging techniques of the present invention. The controller may also be configured to correlate the coordinates of the electron beam with respect to the sample with coordinates on the sample to thereby determine, for example, a location of a determined electrical defect. In one embodiment, the controller is a computer system having a processor and one or more memory devices.

Regardless of the controller's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store images of scanned samples, reference images, defect classification and position data, as well as values for particular operating parameters of the inspection system.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave traveling over an appropriate medium such as airwaves, optical lines, electric lines, etc. Examples of program instructions include both machine code, such as produced by a compiler, and files containing higher level code that may be executed by the computer using an interpreter.

The operating conditions of the charged particle beam tool determine the percentage difference between a reference and target image that will be classified as a defect. The operating conditions may be determined by a calibration procedure which uses a test structure having a known number and type of defects. Initial operating conditions for the inspection system (e.g., scanning electron microscope) are selected. Operating conditions include, but are not limited to, landing energy (for the electron beam), extraction energy, acceleration voltage, sensitivity, threshold, etc. The operating conditions may also include the specific algorithms used to identify defects, such as the predetermined threshold for the difference between a target and reference image. The test structure is then scanned for defects using the selected operating conditions. It is then determined whether the defect capture rate is acceptable. For example, it may determined whether all or a significant portion (greater than 95%) of the known electrical defects have been captured. If the capture rate is acceptable, the calibration procedure is done. If the defect capture rate is not acceptable, the selected operating conditions are then adjusted. For example, the settings of the scanning electron microscope that affect defect detection sensitivity are adjusted. The test structure continues to be scanned for defects and the selected operating conditions adjusted until the defect capture rate is within acceptable limits.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method of inspecting defects in a semiconductor voltage contrast test structure suitable for voltage contrast inspection, the method comprising:
    along a first direction, moving a charged particle beam tool with respect to the voltage contrast test structure to a first area of the voltage contrast test structure so that the first area is within the charged particle beam tool's field of view to thereby determine whether there is a defect present within the voltage contrast test structure;
    when a defect is determined to be present selecting a substructure of the voltage contrast test structure, in which the defect is located, based on an image of the first area obtained by the charged particle beam tool;
    when a substructure has been selected repeatedly stepping the same charged particle beam tool, with respect to the voltage contrast test structure, across the selected substructure and along the same first direction with respect to the voltage contrast test structure so that at each step a next area of the substructure is within the charged particle beam tool's field of view until the defect is located within a particular next area of the substructure; and
    after the defect is located, using the same charged particle beam tool to generate a high resolution image of the defect whereby the image can be used to classify the defect.

2. A method as recited in claim 1, wherein the charged particle beam tool is an electron beam step and repeat system.

3. A method as recited in claim 1, wherein the high resolution image has a resolution that is at least about 0.04 μm.

4. A method as recited in claim 1, wherein determining whether there is a defect present is accomplished by:
    determining whether a voltage potential pattern of the first area corresponds to an expected potential pattern, wherein the voltage potential pattern of the first area is in response to the charged particle beam being directed at the first area; and
    determining that the test structure has a defect when the voltage potential pattern of the first area does not correspond to the expected potential pattern.

5. A method as recited in claim 4, wherein determining whether the voltage potential pattern of the first area corresponds to the expected potential pattern is accomplished by:
 detecting charged particles emitted from the first area in response to the charged particle beam being directed at the first area;
 generating a target image based on the detected charged particles from the first area;
 comparing the target image to a reference image that has no defects;
 determining that the voltage potential pattern of the first area corresponds to the expected potential pattern when a difference between the target image and the reference image is less than a predetermined threshold; and
 determining that the voltage potential pattern of the first area does not correspond to the expected potential pattern when a difference between the target image and the reference image is greater than the predetermined threshold.

6. A method as recited in claim 5, wherein the reference image is generated from a design data base which was used to fabricate the test structure.

7. A method as recited in claim 5, wherein the reference image is generated from a corresponding test structure.

8. A method as recited in claim 4, wherein determining whether the voltage potential pattern of the first area corresponds to the expected potential pattern is accomplished by:
 detecting charged particles emitted from the first area in response to the charged particle beam being directed at the first area, the detected charged particles having an intensity pattern which corresponds to the voltage potential pattern of the first area;
 comparing the detected intensity pattern to an expected intensity pattern that corresponds to an area having no defects;
 determining that the voltage potential pattern of the first area corresponds to the expected potential pattern when a difference between the detected intensity pattern and the expected intensity pattern is less than a predetermined threshold; and
 determining that the voltage potential pattern of the first area does not correspond to the expected potential pattern when a difference between the detected intensity pattern and the expected intensity pattern is not less than the predetermined threshold.

9. A method as recited in claim 4, wherein localizing the defect when present is accomplished by:
 a) directing a charged particle beam of the tool over a next area of the test structure;
 b) determining whether a voltage potential pattern of the current area at which the beam is directed corresponds to a current expected potential pattern, wherein the voltage potential pattern of the current area is in response to the charged particle beam directed at the current area; and
 c) determining that the defect has been located when the voltage potential pattern of the current area does not correspond to a current expected potential pattern.

10. A method as recited in claim 9, further comprising:
 (d) determining that the defect has not been located when the voltage potential pattern of the current area does correspond to the current expected potential pattern; and
 (e) repeating steps (a) through (d) for a next area of the test structure until it is determined that the defect has been located.

11. A method as recited in claim 10, wherein the charged particle beam is directed at the next area by stepping the charged particle tool relative to the test structure from the current area to the next area.

12. A method as recited in claim 11, wherein the stepping is accomplished using a binary or linear search algorithm.

13. A method as recited in claim 10, wherein determining whether the voltage potential pattern of the current area corresponds to the current expected potential pattern is accomplished by:
 detecting charged particles emitted from the current area in response to the charged particle beam being directed at the current area, the detected charged particles having an intensity pattern which corresponds to the voltage potential pattern of to current area;
 comparing the detected intensity pattern of the current area to a current expected intensity pattern that corresponds to an area having no defects;
 determining that the voltage potential pattern of the current area corresponds to the current expected potential pattern when a difference between the detected intensity pattern of the current area and the current expected intensity pattern is less than a current predetermined threshold; and
 determining that the voltage potential pattern of the current area does not correspond to the current expected potential pattern when a difference between the detected intensity pattern and the current expected intensity pattern is not less than the current predetermined threshold.

14. A method as recited in claim 10, wherein determining whether the voltage potential pattern of the current area corresponds to the current expected potential pattern is accomplished by:
 detecting charged particles emitted from the current area in response to the charged particle beam directed at the current area;
 generating a current target image based on the detected charged particles from the current area;
 comparing the current target image to a current reference image that has no defects;
 determining that the voltage potential pattern of the current area corresponds to the current expected potential pattern when a difference between the current target image and the current reference image is less than a current predetermined threshold; and
 determining that the voltage potential pattern of the current area does not correspond to the current expected potential pattern when a difference between the current target image and the current reference image is not less than the current predetermined threshold.

15. A method as recited in claim 4, wherein the expected potential pattern corresponds to one or more conductive portions having about a same voltage potential value.

16. A method as recited in claim 1, wherein the defect is an electrical open.

17. A method as recited in claim 1, wherein the defect is an electrical short.

* * * * *

UNITED STATES PATENT AND TRADEMARK OFFICE
CERTIFICATE OF CORRECTION

PATENT NO. : 7,198,963 B2
APPLICATION NO. : 10/638027
DATED : April 3, 2007
INVENTOR(S) : Verma et al.

It is certified that error appears in the above-identified patent and that said Letters Patent is hereby corrected as shown below:

In the Title Page:

Item (57) Abstract Section, line 11, change "Far" to --For--.

Column 3, line 47, after "voltage" insert --potential pattern of the first area does not correspond to the expected potential pattern when--.

Column 4, line 15, after "one" insert --aspect, a substructure in which the defect is located is first selected, and the current area is--.

Column 4, line 51, after "above" insert --with--.

In line 9 of claim 13 [column 18, line 15] change "to" to --the--.

Signed and Sealed this

Third Day of June, 2008

JON W. DUDAS
*Director of the United States Patent and Trademark Office*